(12) United States Patent
Honda et al.

(10) Patent No.: US 6,476,417 B2
(45) Date of Patent: Nov. 5, 2002

(54) IMAGE-PICKUP SEMICONDUCTOR DEVICE HAVING A LENS, A LIGHT-RECEIVING ELEMENT AND A FLEXIBLE SUBSTRATE THEREBETWEEN WITH A SHADING PLATE BLOCKING UNDESIRED LIGHT RAYS

(75) Inventors: Toshiyuki Honda, Kawasaki (JP); Susumu Kida, Kawasaki (JP); Hideo Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 49 days.

(21) Appl. No.: 09/818,523

(22) Filed: Mar. 28, 2001

(65) Prior Publication Data

US 2002/0047119 A1 Apr. 25, 2002

(30) Foreign Application Priority Data

Oct. 19, 2000 (JP) .................................. 2000-320001

(51) Int. Cl.⁷ .............................................. H01L 29/04
(52) U.S. Cl. ........................ 257/59; 257/798; 257/911
(58) Field of Search ........................ 257/59, 798, 911; 348/373, 374, 335, 340

(56) References Cited

U.S. PATENT DOCUMENTS

| | | | | |
|---|---|---|---|---|
| 4,896,217 A | * | 1/1990 | Miyazawa et al. | 348/294 |
| 5,400,072 A | * | 3/1995 | Izumi et al. | 348/335 |
| 5,576,895 A | * | 11/1996 | Ikeda | 359/811 |
| 5,627,589 A | * | 5/1997 | Ejima et al. | 348/340 |
| 5,673,083 A | * | 9/1997 | Izumi et al. | 348/335 |
| 6,031,998 A | * | 2/2000 | Shono | 348/340 |
| 6,122,009 A | * | 9/2000 | Ueda | 348/335 |

FOREIGN PATENT DOCUMENTS

JP         11-354769         12/1999

* cited by examiner

Primary Examiner—Richard Elms
Assistant Examiner—Douglas M Menz
(74) Attorney, Agent, or Firm—Armstrong, Westerman & Hattori, LLP

(57) ABSTRACT

A semiconductor device for picking up an image includes a lens-mounting unit provided with a lens for picking up an image; a semiconductor chip having a light-receiving element formed on a circuit-forming surface thereof, the light-receiving element converting light from the lens into an image signal; a flexible substrate provided between the lens-mounting unit and the semiconductor chip so as to supply the image signal to an external circuit; and a shading plate blocking light transmitting through the flexible substrate toward the semiconductor chip so as to substantially remove an influence of the light on the light-receiving element.

8 Claims, 11 Drawing Sheets

IMAGE-PICKUP SEMICONDUCTOR DEVICE HAVING A LENS, A LIGHT-RECEIVING ELEMENT AND A FLEXIBLE SUBSTRATE THEREBETWEEN WITH A SHADING PLATE BLOCKING UNDESIRED LIGHT RAYS

BACKGROUND OF THE INVENTION

1. Field of the Invention

The present invention generally relates to an image-pickup semiconductor device and, more particularly, to an image-pickup semiconductor device packaged with a semiconductor element having a light-receiving element and a lens for picking up an image.

Recently, a cellular phone and a handy PC (a portable personal computer) with a miniature camera incorporated therein have been developed. A cellular phone equipped with a miniature camera, for example, picks an image of the speaker by the miniature camera, converts the image into image data, and transmits the image data to another speaker on the other side of the line. Such a miniature camera like this generally comprises a C-MOS sensor and a lens.

Such a cellular phone and a handy PC are being further miniaturized, and accordingly, the miniature camera used in these apparatus is also required to be smaller. To satisfy the needs like this, a semiconductor device package combining a lens and a C-MOS sensor has been developed.

2. Description of the Related Art

Japanese Laid-Open Pat. App. No. 11-17997 discloses a semiconductor device package having a structure combining a lens for picking an image and a semiconductor chip having a C-MOS sensor. In this semiconductor device package, the semiconductor chip having the C-MOS sensor is mounted on a rigid printed substrate by wire bonding, with a light-receiving surface of the semiconductor chip facing upward. The lens is fixed relative to the printed substrate so as to be placed at a predetermined position above the light-receiving surface of the semiconductor chip. Thus, the conventional semiconductor device package as a miniature camera disclosed in Japanese Laid-Open Pat. App. No. 11-17997 comprises the semiconductor chip mounted on the substrate; and the lens placed above the semiconductor chip.

The above-mentioned semiconductor device package has the following disadvantages originating from the structure thereof.

1) In manufacturing the semiconductor chip having a light-receiving element, the back surface of the semiconductor chip is grinded by a polisher so as to reduce the thickness of the semiconductor chip. For this reason, semiconductor chips on different wafers have various thicknesses. Although a range of the variation in thickness is normally about ±15 μm, a tolerable range thereof is about ±30 μm. The varied thickness of the semiconductor chip changes the distance between the light-receiving surface of the semiconductor chip and the lens. In other words, since the lens is placed at a predetermined distance from the surface of the printed substrate, and the light-receiving surface of the semiconductor chip is at a distance equivalent to the thickness of the semiconductor chip from the surface of the printed substrate, the light-receiving surface comes closer to the lens as the thickness of the semiconductor chip is increased, and goes farther from the lens as the thickness of the semiconductor chip is reduced.

The distance between the lens and the light-receiving surface of the semiconductor chip is arranged to be equal to a focal distance of the lens so that light rays transmitting through the lens form an accurate image on the light-receiving surface. Therefore, the above-mentioned varied distance between the lens and the light-receiving surface of the semiconductor chip arouses disadvantages, such as an image out of focus.

2) In mounting the semiconductor chip on the printed substrate, the semiconductor chip is applied and fixed to the surface of the printed substrate by using a dice-applying machine. The dice-applying machine holds the semiconductor chip by sucking the surface (on which the light-receiving element is formed) of the semiconductor chip, and then conveys the semiconductor chip to the printed substrate and places the semiconductor chip thereon. Therefore, the surface of the semiconductor chip is covered by a suction device, preventing a visual recognition of the surface of the semiconductor chip on which the light-receiving element is formed. Instead, the external shape of the semiconductor chip is recognized visually as a basis in adjusting the location of the semiconductor chip on the printed substrate. However, the light-receiving surface and the external shape of the semiconductor chip do not necessarily have a consistent positional relation. In other words, the semiconductor chip, which is formed by dicing a wafer into individual semiconductor chips, has an inconsistent external shape depending on the severing position in dicing. Thereby, the relative position of the light-receiving surface of the semiconductor chip to the external shape of the semiconductor chip is not consistent. Therefore, there are cases where a focal point of the lens does not accurately match the center of the light-receiving surface.

3) Since the semiconductor chip is mounted on the printed substrate by wire bonding, pads for wire bonding have to be provided around the semiconductor chip. Accordingly, the printed substrate needs to have a space to accommodate these pads for wire bonding. This impedes a miniaturization of the semiconductor device package.

4) The semiconductor device package substantially requires a thickness equivalent to a total of the focal distance of the lens and the thickness of the semiconductor chip. However, since the above-mentioned conventional semiconductor device package has the printed substrate placed on the opposite side of the semiconductor chip to the lens, the semiconductor device package actually has a thickness equivalent to a total of the focal distance of the lens and the thickness of the semiconductor chip plus the thickness of the printed substrate. Thus, the thickness of the semiconductor device package is increased by the thickness of the printed substrate.

5) The printed substrate is formed of rigid materials, such as ceramics, or a glass epoxy. Therefore, the printed substrate is not flexible, causing a disadvantage that the semiconductor device package cannot be placed freely when being incorporated into an apparatus. Specifically, there is a restriction that the semiconductor device package has to be directly mounted on a main substrate of a cellular phone or a handy PC, or a flexible wiring substrate has to be provided between the main substrate and the semiconductor device package, in order that the semiconductor device package forming a miniature camera is electrically connected to the main substrate of the cellular phone or the handy PC. This restriction reduces a degree of freedom in designing a body of a cellular phone or a handy PC.

SUMMARY OF THE INVENTION

It is a general object of the present invention to provide an improved and useful image-pickup semiconductor device packaged with a semiconductor element having a light-receiving element and a lens for picking up an image in which device the above-mentioned problems are eliminated.

A more specific object of the present invention is to provide a packaged image-pickup semiconductor device having a smaller thickness and area than a conventional image-pickup semiconductor device package.

In order to achieve the above-mentioned objects, there is provided according to one aspect of the present invention a semiconductor device for picking up an image, the device comprising:

a lens-mounting unit provided with a lens for picking up an image;

a semiconductor chip having a light-receiving element formed on a circuit-forming surface thereof, the light-receiving element converting light from the lens into an image signal;

a flexible substrate provided between the lens-mounting unit and the semiconductor chip so as to supply the image signal to an external circuit; and a shading plate blocking light transmitting through the flexible substrate toward the semiconductor chip so as to substantially remove an influence of the light on the light-receiving element.

According to the present invention, the substrate on which the semiconductor chip is mounted is placed between the circuit-forming surface of the semiconductor chip and the lens. Thereby, the thickness of the substrate can be included in the distance between the lens and the light receiving-element formed on the circuit-forming surface of the semiconductor chip, i.e., the focal distance of the lens, without increasing the focal distance. Accordingly, the thickness of the image-pickup semiconductor device is substantially equal to a total of the focal distance of the lens and the thickness of the semiconductor chip. In other words, the thickness of the substrate does not add to the thickness of the entire image-pickup semiconductor device, reducing the thickness thereof to that extent. Additionally, although the flexible substrate has a property of transmitting light, the shading plate can block the light transmitting through the substrate so as to substantially exclude an influence of the light over the light-receiving element. This prevents a deterioration of the image.

Additionally, in the image-pickup semiconductor device according to the present invention, the semiconductor chip may be mounted on the flexible substrate with the circuit-forming surface facing the flexible substrate so that the light-receiving element opposes the lens through an opening formed in the flexible substrate.

According to the present invention, since an opening is formed in the substrate, the light-receiving element formed on the circuit-forming surface can be placed opposite to the lens provided on the other side of the substrate through the opening, even in a case where the semiconductor chip is mounted on the substrate by flip chip mounting, etc. In addition, in mounting the semiconductor chip on the substrate, the surface of the semiconductor chip opposite to the circuit-forming surface can be supported, the semiconductor chip can be mounted while the circuit-forming surface being visually recognized. Thereby, the semiconductor chip can be mounted on the substrate with a high positional precision.

Additionally, in the image-pickup semiconductor device according to the present invention, the lens-mounting unit may have a locating pin, and the flexible substrate may have a locating hole so that, in a state where the locating pin is inserted into the locating hole, the lens-mounting unit is fixed on a surface of the flexible substrate by an adhesive, the surface being opposite to a surface on which the semiconductor chip is mounted.

According to the present invention, by inserting the locating pin of the lens-mounting unit into the locating hole formed in the substrate, the lens-mounting unit can be mounted on the substrate with a high positional precision. Since the semiconductor chip can also be mounted on the substrate with a high positional precision, as mentioned above, the lens and the semiconductor chip can be assembled with a high positional precision.

Additionally, in the image-pickup semiconductor device according to the present invention, the shading plate may extend from the lens-mounting unit toward the semiconductor chip in an opening formed in the flexible substrate.

According to the present invention, the shading plate can be formed as a part of the lens-mounting unit, easily achieving the light-blocking effect for the light-receiving element.

Additionally, in the image-pickup semiconductor device according to the present invention, the shading plate may be formed of an elastic material, an end of the shading plate adjoining the circuit-forming surface.

According to the present invention, the shading plate adjoins the circuit-forming surface of the semiconductor chip so that the shading plate completely blocks the light transmitting through the substrate. Additionally, when the shading plate adjoins the circuit-forming surface, the shading plate undergoes an elastic deformation so as not to harm the circuit-forming surface.

Additionally, in the image-pickup semiconductor device according to the present invention, the shading plate may be formed as a part of the lens-mounting unit, an end of the shading plate being fixed on the circuit-forming surface by an adhesive.

According to the present invention, the lens-mounting unit can be fixed directly on the circuit-forming surface of the semiconductor chip via the shading plate that is a part of the lens-mounting unit. This excludes an influence on the light-receiving element by the light transmitting through the substrate, and also excludes a possibility that a variation in thickness of the substrate influences the distance between the lens and the light-receiving element.

Additionally, in the image-pickup semiconductor device according to the present invention, the lens-mounting unit may have a diaphragm defining an opening functioning as an aperture for the lens, an end of the diaphragm being an inclined surface inclined by a predetermined angle from an optical axis of the lens.

According to the present invention, light rays can be kept from reflecting on the end surface of the diaphragm and then entering the light-receiving element. This avoids a deterioration of the image.

Additionally, in the image-pickup semiconductor device according to the present invention, the flexible substrate may have a wiring outlet to be connected to the external circuit, an electric component being mounted on the wiring outlet.

According to the present invention, an electric component can be mounted on the wiring outlet in an effective utilization of space so as to increase a packaging density of the image-pickup semiconductor device.

In order to achieve the above-mentioned objects, there is also provided according to another aspect of the present invention a semiconductor device for picking up an image, the device having a lens-mounting unit provided with a lens for picking up an image; a semiconductor chip having a light-receiving element formed thereon, the light-receiving element converting light from the lens into an image signal; and a substrate having the semiconductor chip mounted thereon, wherein the lens-mounting unit has an upper portion provided with the lens; and an lower portion fixed on the substrate, the upper portion having a structure capable of moving relative to the lower portion in a direction approaching the substrate and in a direction departing from the substrate so that a distance between the lens and the semiconductor chip is variable.

According to the present invention, the distance between the lens and the semiconductor chip can be varied so as to adjust the focus of the lens to the light-receiving element in any case. Thereby, an image in focus can always be achieved.

Additionally, the image-pickup semiconductor device according to the present invention may further comprise a remove-stopper mechanism preventing the upper portion from being removed from the lower portion when the upper portion moves in the direction departing from the substrate.

According to the present invention, the remove-stopper mechanism prevents a vibration of the image-pickup semiconductor device, for example, from causing the upper portion to be detached from the lower portion.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

Figure 1A:
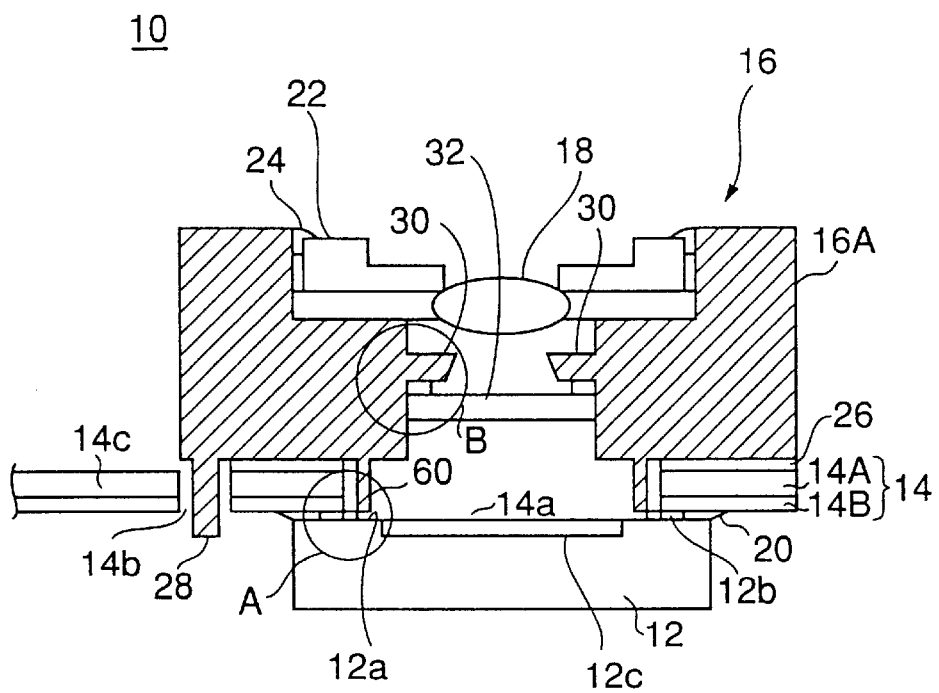
FIG. 1A is a cross-sectional view of an image-pickup semiconductor device according to a first embodiment of the present invention.
Figure 1B:
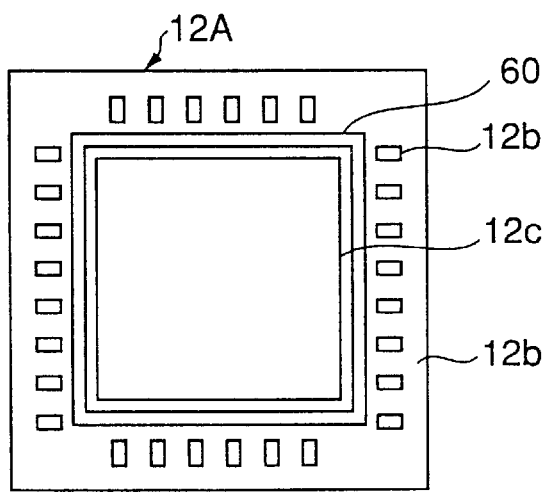
FIG. 1B is a plan view of a light-receiving surface of a semiconductor chip shown in FIG. 1A.

FIG. 1A is a cross-sectional view of an image-pickup semiconductor device according to a first embodiment of the present invention. FIG. 1B is a plan view of a light-receiving surface of a semiconductor chip shown in FIG. 1A. An image-pickup semiconductor device 10 according to the first embodiment of the present invention comprises a semiconductor chip 12 for picking up a solid image; a TAB tape substrate 14; and a lens-mounting unit 16.

The semiconductor chip 12 is mounted on the TAB tape substrate 14 by flip chip mounting. The lens-mounting unit 16 has a structure of an optical system including a lens (an objective lens) 18, and is mounted on the opposite side of the TAB tape substrate 14 to the semiconductor chip 12. In other words, the semiconductor chip 12 and the lens-mounting unit 16 are mounted on both sides of the TAB tape substrate 14, respectively.

The semiconductor chip 12 has a C-MOS sensor 12c formed on a circuit-forming surface (a light-receiving surface) 12a as a light-receiving element for picking up an image. The semiconductor chip 12 is mounted on the TAB tape substrate 14 by flip chip mounting with the circuit-forming surface 12a facing the TAB tape substrate 14.

The TAB tape substrate 14 has an opening 14a formed at a position corresponding to the C-MOS sensor 12c (the light-receiving element) on the circuit-forming surface 12a of the semiconductor chip 12. Therefore, when the semiconductor chip 12 is mounted on the TAB tape substrate 14, the C-MOS sensor 12c of the semiconductor chip 12 is in the opening 14a of the TAB tape substrate 14.

The TAB tape substrate 14 comprises a polyimide tape 14A, and a wiring 14B formed thereon. The wiring 14B is formed by applying a copper foil to the polyimide tape 14A and patterning the copper foil. The semiconductor chip 12 has a bump 12b formed thereon as an external connection terminal. The bump 12b is bonded to a bonding pad of the TAB tape substrate 14 by an anisotropic conductive resin 20, the bonding pad being formed as a part of the wiring 14B of the TAB tape substrate 14. It is noted that the polyimide tape 14A is not the only choice, but can be replaced by an appropriately flexible material, such as a polyester tape.

Additionally, not only the copper foil but also other materials, such as an aluminum foil, can be used in forming the wiring 14B.

A body 16A of the lens-mounting unit 16 has a through opening at the center thereof; and the lens 18 covering the upper end of the opening. The lens 18 is fit to the upper end of the opening of the body 16A, and is fixed by a lens-pressing lid 22. The lens-pressing lid 22 is fixed to the body 16A by an adhesive 24.

The lens-mounting unit 16 is fixed to the TAB tape substrate 14 by an adhesive 26, with the opening of the body 16A matching the opening 14a of the TAB tape substrate 14. The body 16A has a locating pin 28. The body 16A of the lens-mounting unit 16 is located accurately by the locating pin 28 being inserted into a locating hole 14b formed in the TAB tape substrate 14.

The locating hole 14b in the TAB tape substrate 14 is formed by such a method as etching based on a locating hole for a wiring pattern so as to be positioned with high precision to the wiring pattern. Therefore, by inserting the locating pin 28 into the locating hole 14b, the lens-mounting unit 16 can be located and mounted on the TAB tape substrate 14 with high precision.

A diaphragm 30 is formed in the opening of the body 16A of the lens-mounting unit 16, beneath the lens 18. Still below the diaphragm 30 is placed an IR filter 32.

In the above-described structure, light collected by the lens 18 passes through the diaphragm 30 and the IR filter 32, and enters the C-MOS sensor 12c formed on the circuit-forming surface 12a of the semiconductor chip 12. A distance between the lens 18 and the circuit-forming surface 12a is determined so as to be equal to a focal distance of the lens 18. Therefore, light that enters the lens 18 is collected on the C-MOS sensor 12c and forms an image thereon.

The image on the C-MOS sensor 12c is converted into an electric signal thereby, and is supplied as an image signal to an external device via a wiring outlet 14c of the TAB tape substrate 14.

Figure 2A:
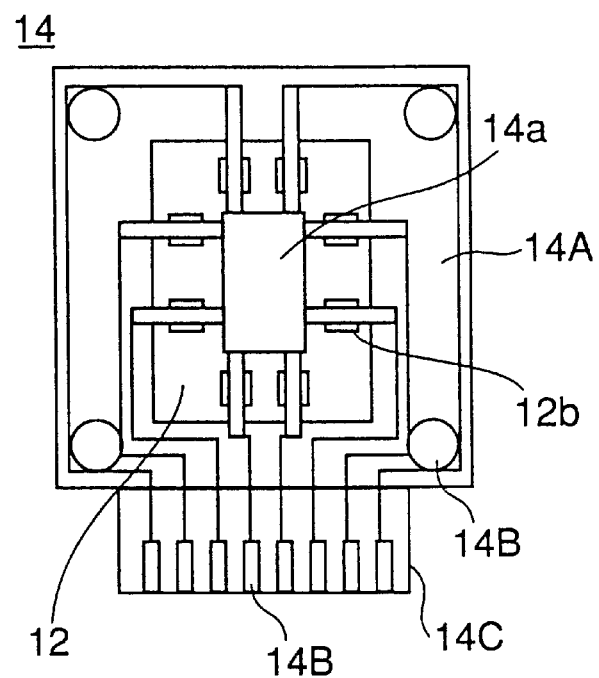
FIG. 2A is a plan view of a TAB tape substrate shown in FIG. 1A.
Figure 2B:
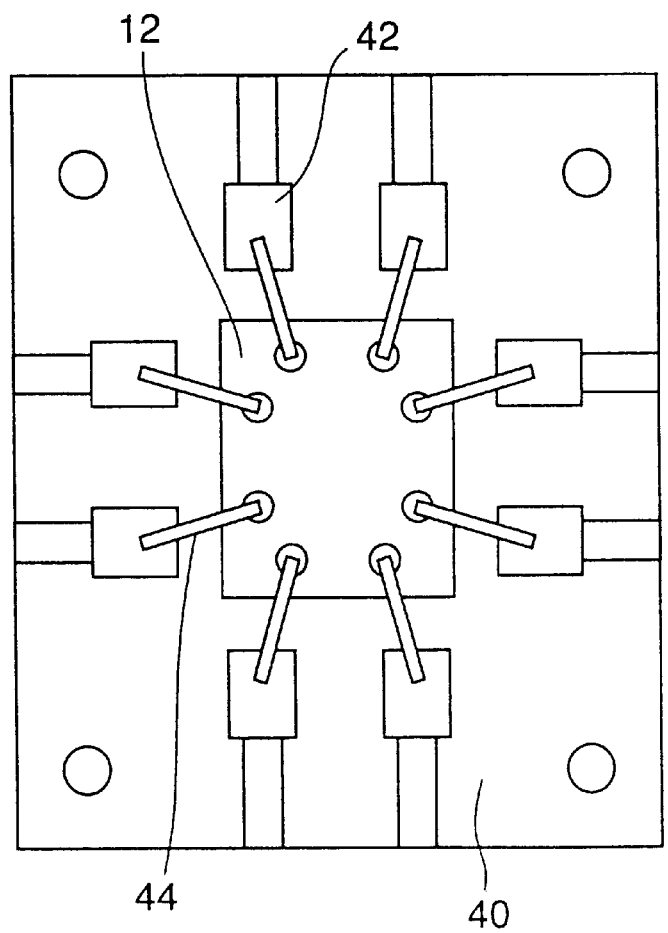
FIG. 2B is a plan view of a printed substrate on which a semiconductor chip is mounted by wire bonding.

FIG. 2A is a plan view of the above-mentioned TAB tape substrate 14. FIG. 2B is an illustration used to be compared with the TAB tape substrate 14a shown in FIG. 2A, and is a plan view of a substrate on which the semiconductor chip 12 is mounted by wire bonding.

In a substrate 40 shown in FIG. 2B, a pad 42 for wire bonding is provided around the semiconductor chip 12. An electrode of the semiconductor chip 12 is electrically connected to the pad 42 by a bonding wire 44. Therefore, there needs to be a space around the semiconductor chip 12 for providing the pad 42.

On the other hand, in the TAB tape substrate 14 shown in FIG. 2A, since the semiconductor chip 12 is mounted thereon by flip chip mounting, a pad of the TAB tape substrate 14 overlaps an electrode of the semiconductor chip 12. Thus, a region provided with the pad is inside the semiconductor chip 12, and hence there is no need to have a space around the semiconductor chip 12 for providing the pad 42 as shown in FIG. 2B. Therefore, an area (an outside dimension) of the TAB tape substrate 14 according to the present embodiment shown in FIG. 2A can be made smaller than the substrate shown in FIG. 2B. Accordingly, an entire dimension of the image-pickup semiconductor device 10 can be made smaller.

Figure 3:
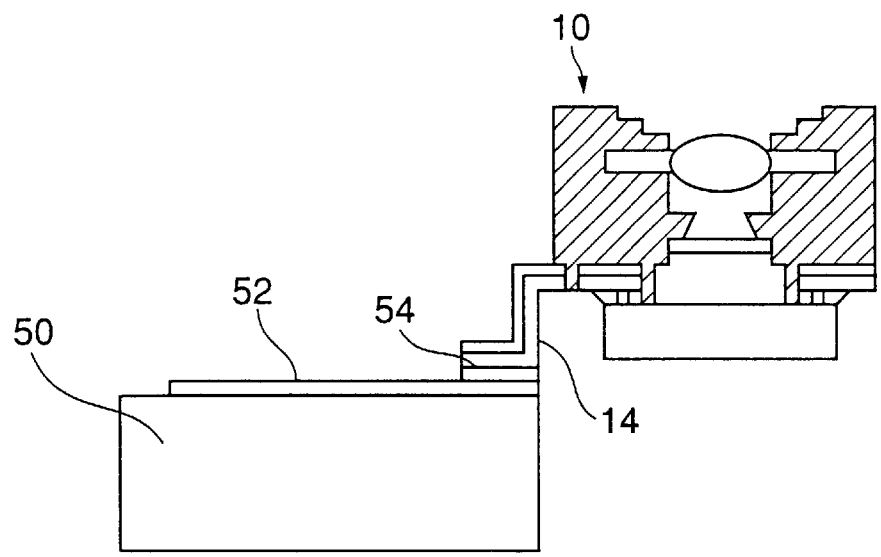
FIG. 3 is an illustration of an example where the image-pickup semiconductor device shown in FIG. 1A is connected to an external circuit.

FIG. 3 is an illustration of an example where the image-pickup semiconductor device 10 shown in FIG. 1A is connected to an external circuit. The image-pickup semiconductor device 10 is, for example when incorporated in a cellular phone, connected to a printed substrate 50 provided in the cellular phone. Specifically, the wiring outlet 14c of the TAB tape substrate 14 of the image-pickup semiconductor device 10 is connected to a wiring 52 of the printed substrate 50 by a solder 54.

At this point, since the TAB tape substrate 14 is composed of a flexible material such as polyimide, the TAB tape substrate 14 can be bent freely after the soldering. In the example shown in FIG. 3, the image-pickup semiconductor device 10 is placed above the printed substrate 50 by bending the TAB tape substrate 14. Thus, using the flexible TAB tape substrate 14 can provide variations in designing a body of an apparatus (a cellular phone in this example) in which the image-pickup semiconductor device 10 is incorporated.

In a case of using an inflexible substrate in place of the TAB tape substrate 14, connecting the image-pickup semiconductor device 10 and the printed substrate 50 by providing a flexible substrate therebetween may increase variations in positioning the image-pickup semiconductor device 10. However, providing the flexible substrate requires an extra area for mounting the flexible substrate, and also necessitates a complicated manufacturing process.

Figure 4:
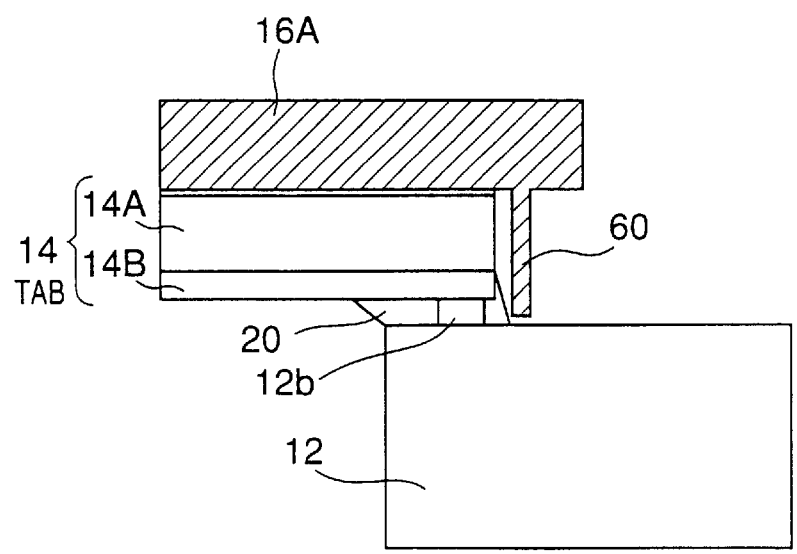
FIG. 4 is a magnified view of part A in FIG. 1A.

FIG. 4 is a magnified view of part A in FIG. 1A. A shading plate 60 is formed on the bottom of the body 16A of the lens-mounting unit 16. The shading plate 60 is arranged so as to cover the entire inner surfaces of the opening 14a of the TAB tape substrate 14 when the lens-mounting unit 16 is mounted on the TAB tape substrate 14 (see FIG. 1B).

Figure 5A:
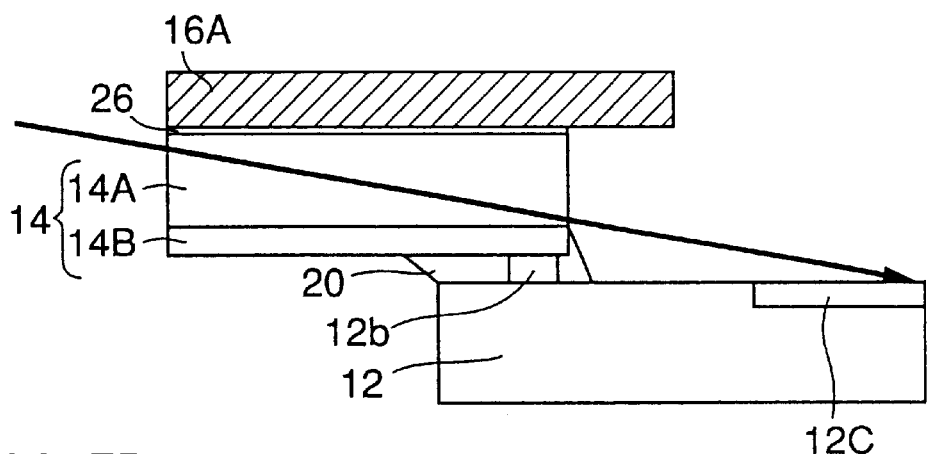
FIG. 5A shows the absence of a shading plate shown in FIG. 1A for explaining functions thereof.
Figure 5B:
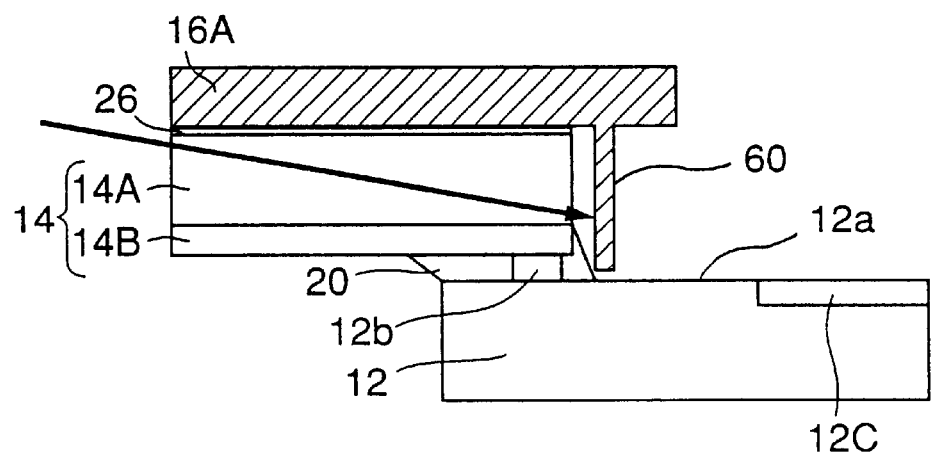
FIG. 5B shows the presence of the shading plate shown in FIG. 1A for explaining the functions thereof.

FIG. 5A shows the absence of the shading plate 60 for explaining functions thereof. FIG. 5B shows the presence of the shading plate 60 for explaining functions thereof.

In a case of the shading plate 60 not provided, as shown in FIG. 5A, light (indicated by an arrow in FIG. 5A) transmitting through the polyimide tape 14A of the TAB tape 14 enters the opening 14a. That is, when a resin tape, such as a polyimide tape or a polyethylene tape, is used to form the flexible TAB tape substrate 14, light rays come into the opening 14a of the TAB tape substrate 14 since these tapes are relatively transparent. Some of the light rays coming in the opening 14a enter a light-receiving portion 12c (the C-MOS sensor), and cause a halation so as to deteriorate the image.

However, in the present embodiment, as shown in FIG. 1B and FIG. 5B, since the shading plate 60 covers the entire inner surfaces of the opening 14a, light (indicated by an arrow in FIG. 5B) transmitting through the polyimide tape 14A is blocked by the shading plate 60, and thus does not reach the light-receiving portion 12c. Therefore, providing the shading plate 60 prevents the light transmitting through the TAB tape substrate 14 from causing a halation, and thus avoids a deterioration of the image.

It should be noted that, although a slight gap may be formed between the shading plate 60 and the circuit-forming surface (the light-receiving surface) 12a of the semiconductor chip 12, and light may leak in through the gap, the amount of the leaking light is too slight to substantially affect the light-receiving surface 12a.

Figure 6:
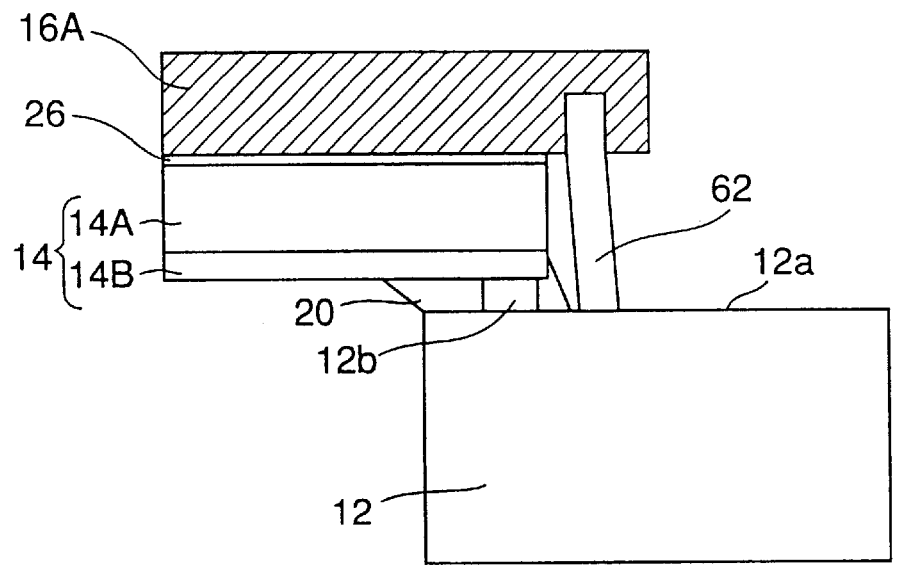
FIG. 6 is a cross-sectional view showing a variation of the shading plate shown in FIG. 5B.

FIG. 6 is a cross-sectional view showing a variation of the shading plate 60. A shading plate 62 shown in FIG. 6 is made of an elastic material and is mounted on the body 16A of the lens-mounting unit 16. A method of mounting the shading plate 62 may comprise: forming an insertion-acceptance portion in the body 16A so as to accept a part of the shading plate 62, and then inserting the shading plate 62 therein; or fixing the shading plate 62 by an adhesive, etc.

The shading plate 62 is arranged to protrude from the bottom of the body 16A a little longer than the distance from the bottom of the body 16A to the circuit-forming surface 12a of the semiconductor chip 12. Thereby, in a state where the semiconductor chip 12 and the lens-mounting unit 16 are mounted on the TAB tape substrate 14, the shading plate 62 adjoins the circuit-forming surface 12a of the semiconductor chip 12 without making a gap between the shading plate 62 and the circuit-forming surface 12a. Therefore, the light transmitting through the TAB tape substrate 14 is blocked completely by the shading plate 62, and thus never reaches the light-receiving surface 12a in the opening 14a. It is noted that, since the shading plate 62 is formed of an elastic material, the shading plate 62 adjoins the circuit-forming surface 12a elastically without harming the circuit-forming surface 12a.

Figure 7:
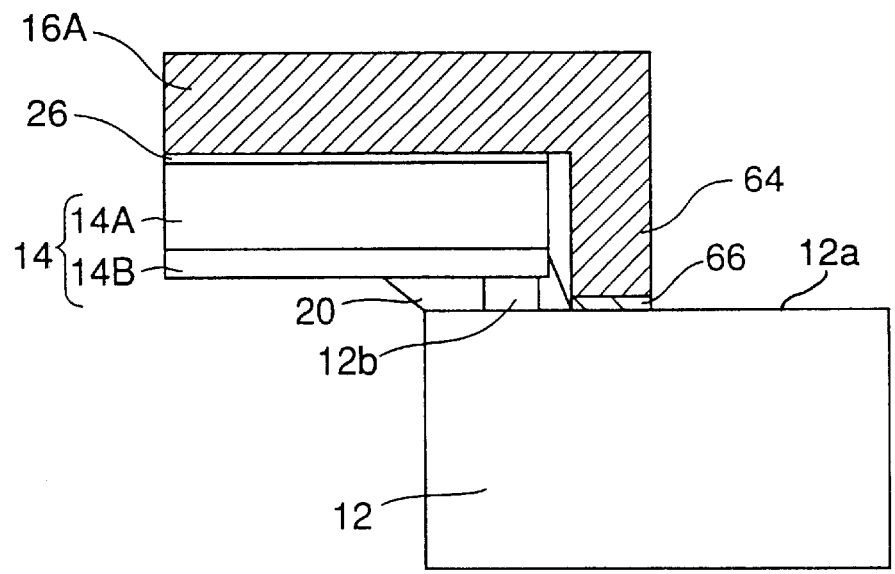
FIG. 7 is a cross-sectional view showing a variation of a mounting structure of a lens-mounting unit on the semiconductor chip shown in FIG. 1A.

FIG. 7 is a cross-sectional view showing a variation of a mounting structure of the lens-mounting unit 16 including a shading plate. In the variation shown in FIG. 7, a shading plate 64 has a relatively large thickness as a part of the lens-mounting unit 16. The body 16A is fixed to the circuit-forming surface 12a of the semiconductor chip 12 via the shading plate 64 by an adhesive 66. In other words, the lens-mounting unit 16 is not mounted on the TAB tape substrate 14, but fixed on the semiconductor chip 12.

According to the structure shown in FIG. 7, the lens-mounting unit 16 constituting an optical system can be kept detached from the TAB tape substrate 14. This prevents an external force acting on the lens-mounting unit 16 from acting directly on the TAB tape substrate 14.

For example, in a case where the image-pickup semiconductor device 10 is incorporated in a cellular phone, the lens-mounting unit 16 is mounted on a body of the cellular phone. In the course of this mounting, an external force acts on the lens-mounting unit 16. If this external force acts on such a portion having to do with electric signals as the TAB tape substrate 14, this may cause inferiority in the electric portion, reducing reliability thereof.

However, in the variation shown in FIG. 7, since the body 16A of the lens-mounting unit 16 does not contact the TAB tape substrate 14, the above-mentioned problem originating from the external force acting on the lens-mounting unit 16 does not occur. Additionally, since the shading plate 64 formed as a part of the body 16A is fixed to the circuit-forming surface 12a of the semiconductor chip 12 by the adhesive 66, the light transmitting through the TAB tape substrate 14 can be completely block thereby.

Figure 8:
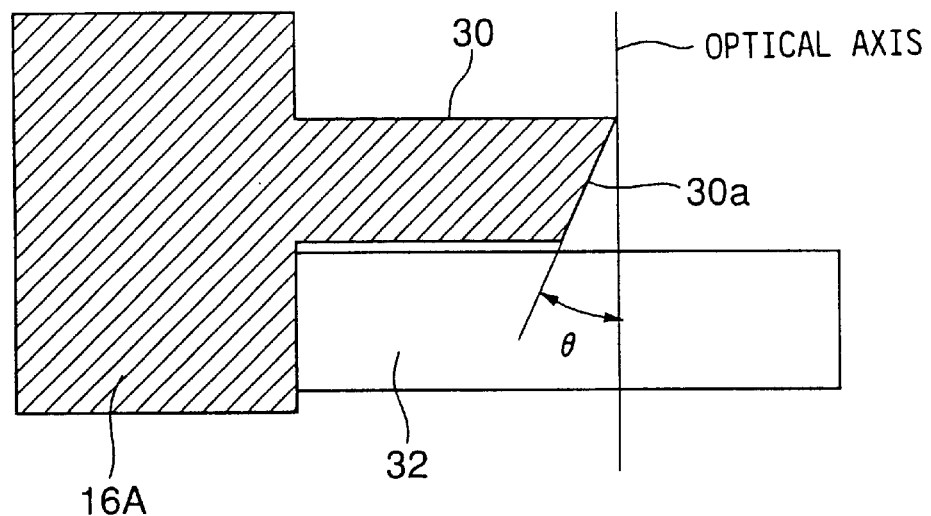
FIG. 8 is a magnified view of part B in FIG. 1A.
Figure 9:
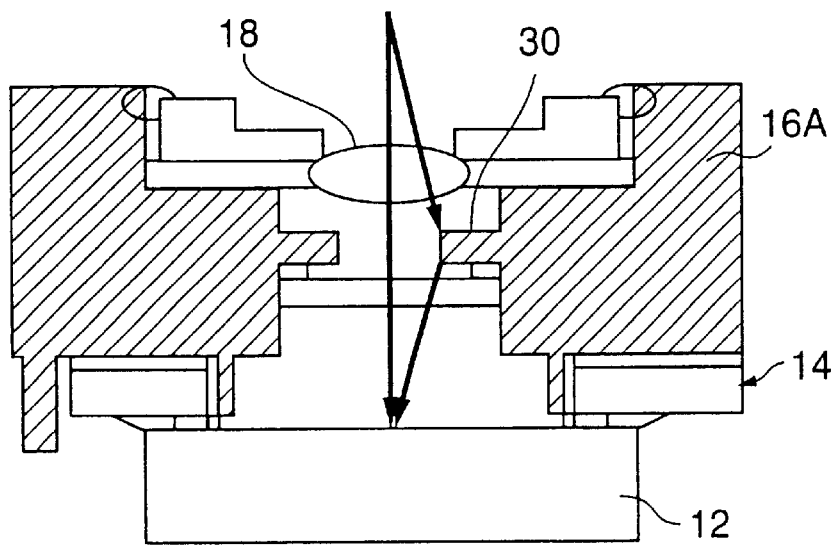
FIG. 9 is an illustration showing paths of light rays in a case where an inclined surface is not provided for a diaphragm shown in FIG. 8.

FIG. 8 is a magnified view of part B in FIG. 1A. As shown in FIG. 8, the diaphragm 30 according to the present embodiment has an inclined surface 30a formed at an end thereof, the inclined surface 30a being inclined by a predetermined angle θ from an optical axis of the lens 18. FIG. 9 is an illustration showing paths of light rays in a case where the inclined surface 30a is not provided. In this case, light rays transmitting through the lens 18 and then reaching an end surface of the diaphragm 30 reflect on the end surface and then enter the light-receiving surface 12a so as to deteriorate the image. To prevent this problem, in the present embodiment, the inclined surface 30a inclined by the predetermined angle θ from the optical axis of the lens 18 is provided so that the light rays transmitting through the lens 18 do not reflect on the end surface of the diaphragm 30 so as to reach the light-receiving surface 12a.

Figure 10:
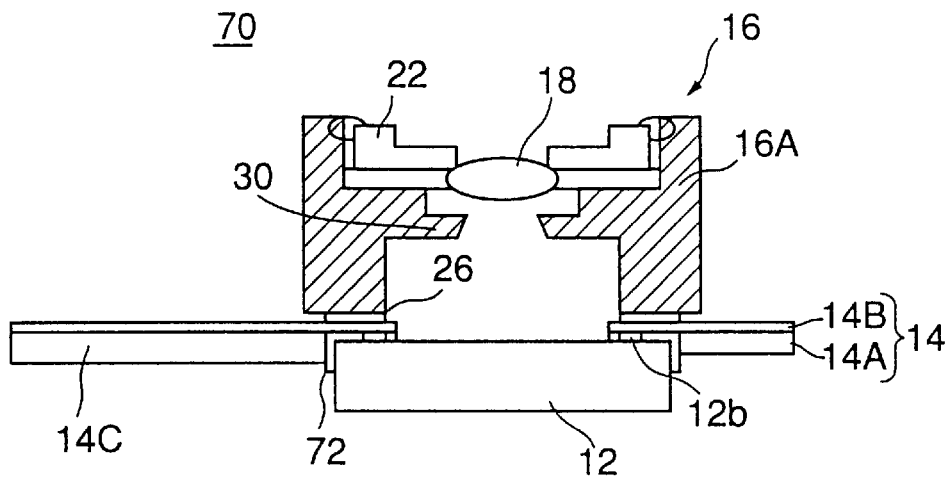
FIG. 10 is a cross-sectional view of an image-pickup semiconductor device according to a second embodiment of the present invention.

Next, a description will be given, with reference to FIG. 10, of a second embodiment according to the present invention. FIG. 10 is a cross-sectional view of an image-pickup semiconductor device 70 according to the second embodiment of the present invention. It is noted that elements in FIG. 10 that are identical or equivalent to the elements shown in FIG. 1 are referenced by the same reference marks, and will not be explained in detail.

The image-pickup semiconductor device 70 according to the second embodiment of the present invention has an opening in the polyimide tape 14A of the TAB tape substrate 14 formed beforehand so as to accommodate the semiconductor chip 12. Then, a tin plating is provided on the wiring 14B formed by patterning such a material as an copper foil by etching. The bump 12b of the semiconductor chip 12 is formed as a gold bump. The gold bump 12b and the wiring 14B are joined by an ILB connection (a gold-tin eutectic connection). After the joining of the gold bump 12b and the wiring 14B, a fill-up resin 72 is applied near the joint of the gold bump 12b by potting. Then, the lens-mounting unit 16 is placed on the fill-up resin 72, and is fixed by the adhesive 26.

According to the present embodiment, the TAB tape substrate 14 is used in an inverted position, compared with the above-mentioned first embodiment, and the polyimide tape 14A of the TAB tape substrate 14 is not positioned between the lens-mounting unit 16 and the semiconductor chip 12. Therefore, even when the thickness of the polyimide tape 14A may be varied, the distance between the lens 18 and the semiconductor chip 12 is kept constant. Additionally, there is no need to provide the shading plate to block the light transmitting through the polyimide tape 14A.

Figure 11:
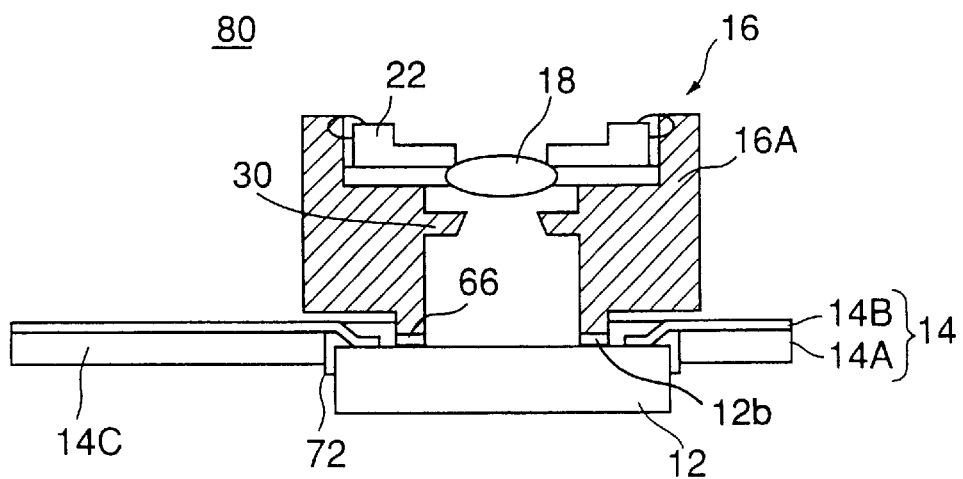
FIG. 11 is a cross-sectional view of an image-pickup semiconductor device according to a third embodiment of the present invention.

Next, a description will be given, with reference to FIG. 11, of a third embodiment according to the present invention. FIG. 11 is a cross-sectional view of an image-pickup semiconductor device 80 according to the third embodiment of the present invention. It is noted that elements in FIG. 11 that are identical or equivalent to the elements shown in FIG. 1 are referenced by the same reference marks, and will not be explained in detail.

The image-pickup semiconductor device 80 according to the third embodiment of the present invention has an opening in the polyimide tape 14A of the TAB tape substrate 14 formed beforehand so as to accommodate the semiconductor chip 12. Then, a gold plating is provided on the wiring 14B formed by patterning such a material as an copper foil by etching. The bump 12b of the semiconductor chip 12 and the gold-plated wiring 14B are connected by single-point bonding. After connecting the bump 12b and the wiring 14B, the fill-up resin 72 is applied near the joint of the bump 12b by potting. Then, the lens-mounting unit 16 having the structure shown in FIG. 7 is placed on the circuit-forming surface 12a of the semiconductor chip 12, and is fixed by the adhesive 66.

According to the present embodiment, the TAB tape substrate 14 is used in an inverted position, compared with the above-mentioned first embodiment, and the polyimide tape 14A of the TAB tape substrate 14 is not positioned between the lens-mounting unit 16 and the semiconductor chip 12. Therefore, even when the thickness of the polyimide tape 14A may be varied, the distance between the lens 18 and the semiconductor chip 12 is kept constant. Additionally, since the lens-mounting unit 16 is bonded directly on the circuit-forming surface 12a without creating a gap between the lens-mounting unit 16 and the semiconductor chip 12, undesired light rays can be kept from entering the light-receiving surface 12a of the semiconductor chip 12.

Figure 12:
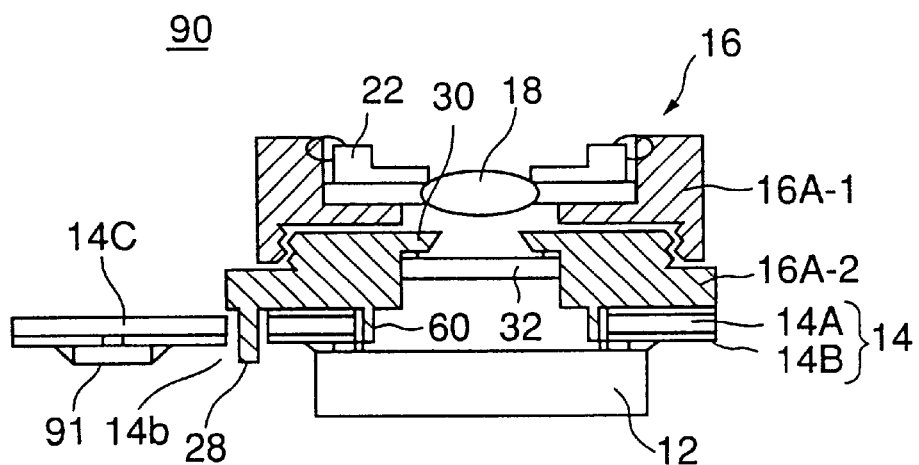
FIG. 12 is a cross-sectional view of an image-pickup semiconductor device according to a fourth embodiment of the present invention.

Next, a description will be given, with reference to FIG. 12, of a fourth embodiment according to the present invention. FIG. 12 is a cross-sectional view of an image-pickup semiconductor device 90 according to the fourth embodiment of the present invention. It is noted that elements in FIG. 12 that are identical or equivalent to the elements shown in FIG. 1 are referenced by the same reference marks, and will not be explained in detail.

The image-pickup semiconductor device 90 shown in FIG. 12 basically has the same structure as the image-pickup semiconductor device 10 shown in FIG. 1, except that the body 16A of the lens-mounting unit 16 is divided into an upper portion 16A-1 and a lower portion 16A-2. Additionally, in the present embodiment, an electronic component 91 is mounted and soldered on the wiring outlet 14c of the TAB tape substrate 14 so as to effectively utilize the wiring outlet 14c, achieving a high-density packaging.

The lens 18 is mounted to the upper portion 16A-1. The diaphragm 30, the IR filter 32 and the shading plate 60 are provided for the lower portion 16A-2. The upper portion 16A-1 and the lower portion 16A-2 are connected to each other by screwing the upper portion 16A-1 relative to the lower portion 16A-2 so that the upper portion 16A-1 can be detached from the lower portion 16A-2. That is, the lens 18 in the optical system can be removed from the image-pickup semiconductor device 90.

The electronic component 91 is soldered on the TAB tape substrate 14 by solder reflowing. In this course, since the lens 18 is a plastic lens, the plastic lens 18 may be damaged by the heat of the solder reflowing. To solve this problem, in the present embodiment, the upper portion 16A-1 can be detached from the image-pickup semiconductor device 90 during the solder reflowing. Connecting the upper portion 16A-1 to the lower portion 16A-2 by screwing after the solder reflowing can facilitate the incorporation of the lens 18.

Additionally, although unnecessary in the present and the above-mentioned embodiments, the distance between the lens 18 and the circuit-forming surface (the light-receiving surface) 12a of the semiconductor chip 12 can be made variable. That is, revolving the upper portion 16A-1 relative to the lower portion 16A-2 causes the lens 18 to move up or down so as to change the distance between the lens 18 and the circuit-forming surface 12i a.

Figure 13:
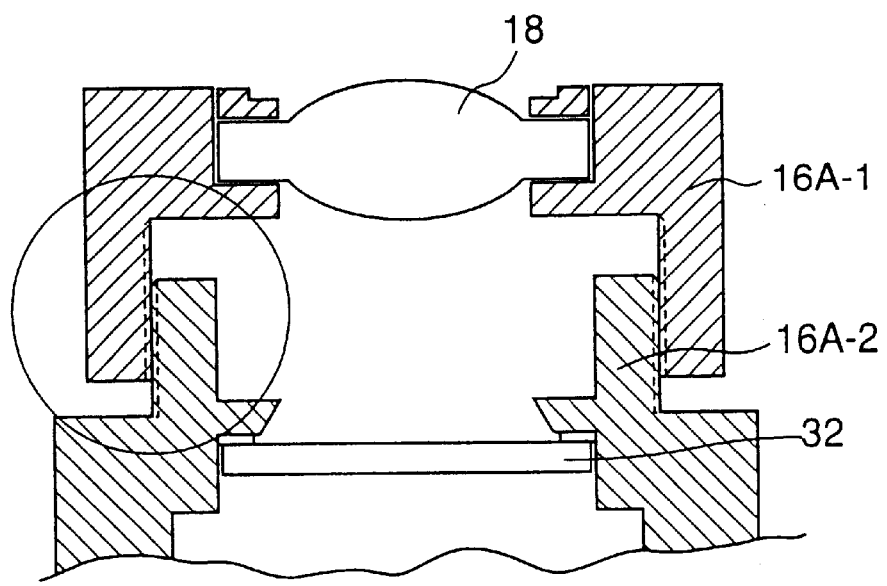
FIG. 13 is a magnified cross-sectional view of screw-connection parts of an upper portion and a lower portion shown in FIG. 12.

FIG. 13 is a magnified cross-sectional view including the screw-connection parts of the upper portion 16A-1 and the lower portion 16A-2. The screw-connection parts of the upper portion 16A-1 and the lower portion 16A-2 are indicated by a circle in FIG. 13. In the screw-connection, vibration or other factors may make the screw-connection parts loose and cause the upper portion 16A-1 to revolve relative to the lower portion 16A-2 so as to change the distance between the lens 18 and the semiconductor chip 12, or to remove the upper portion 16A-1 from the lower portion 16A-2.

To deal with these problems, the present embodiment employs a remove-stopper and a revolve-stopper. First, a description will be given, with reference to FIG. 14 to FIG. 17 of the remove-stopper.

Figure 14:
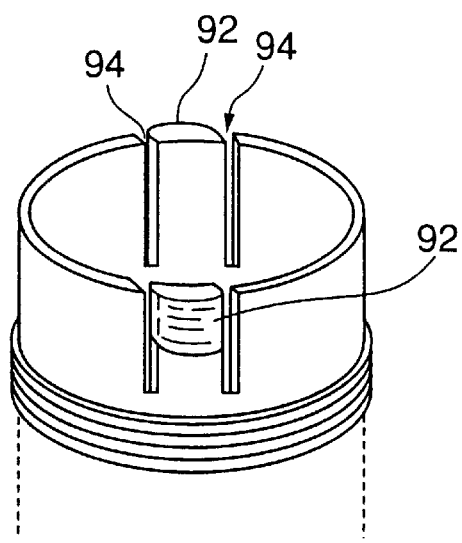
FIG. 14 is a perspective view of the screw-connection part of the lower portion shown in FIG. 12.

FIG. 14 is a perspective view of the screw-connection part of the lower portion 16A-2. A pair of diametrically opposing projections 92 are provided at the top of the screw-connection part of the lower portion 16A-2. Each of the projections 92 is provided between a pair of slits 94 formed vertically. A portion between the slits 94 has an enough width to undergo elastic deformation when an external force acts in a diametrical direction.

Figure 15:
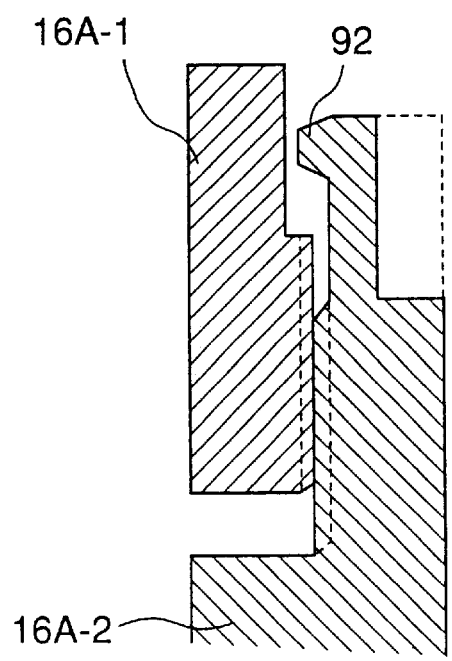
FIG. 15 is a magnified cross-sectional view of a part where a projection is provided for the lower portion shown in FIG. 14.

FIG. 15 is a magnified cross-sectional view of a part where the projection 92 is provided. The part where the projection 92 is provided is thin in a radial direction, and thus is capable of undergoing elastic deformation in a radial direction easily. The projection 92 projects outwardly from the screw-connection part of the lower portion 16A-2 in a radial direction. The upper-end surface of the projection 92 has a proper inclination so that the projection 92 can easily undergo elastic deformation inwardly in a radial direction when the screw-connection part of the upper portion 16A-1 is screwed to fit the screw-connection part of the lower portion 16A-2. That is, pressing the screw-connection part of the upper portion 16A-1 against the upper-end surface of the projection 92 causes the projection 92 to undergo elastic deformation inwardly in a radial direction so that the screw-connection part of the upper portion 16A-1 can be easily screwed to fit the screw-connection part of the lower portion 16A-2.

Upon completion of screwing the screw-connection part of the upper portion 16A-1 to fit the screw-connection part of the lower portion 16A-2, the projection 92 that has undergone the elastic deformation returns to its previous position. Therefore, when the screw-connection part of the upper portion 16A-1 is moved in a reverse direction to be removed from the screw-connection part of the lower portion 16A-2, the screw-connection part of the upper portion 16A-1 encounters the lower-end surface of the projection 92. Thereby, when vibration, for example, causes the upper portion 16A-1 to revolve so as to move in the removing direction, the lower-end surface of the projection 92 prevents a further movement of the upper portion 16A-1. Thus, the lower-end surface of the projection 92 functions as a remove-stopper for the upper portion 16A-1.

It should be noted that, when the upper portion 16A-1 is intended to be removed, the upper portion 16A-1 can be forcibly revolved in the removing direction so that the projection 92 undergoes elastic deformation inwardly in a radial direction to allow the movement of the screw-connection part of the upper portion 16A-1. That is, the projection 92 function as a remove-stopper when a small revolving force due to vibration and so on acts on the upper portion 16A-1, and, on the other hand, allows the movement of the upper portion 16A-1 when a large revolving force acts on the upper portion 16A-1.

Figure 16A:
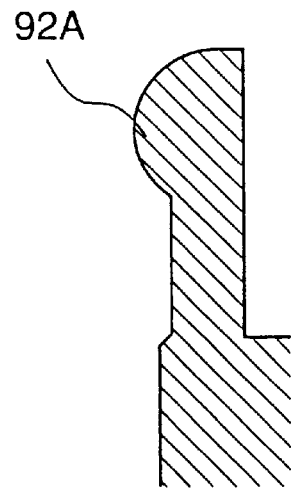
FIG. 16A is a cross-sectional view of a variation of the projection shown in FIG. 15.

FIG. 16A is a cross-sectional view of a variation of the projection 92. A projection 92A shown in FIG. 16A has an upper-end surface and a lower-end surface being roundish so that the screw-connection part of the upper portion 16A-1 can move smoothly along the projection 92A.

Figure 16B:
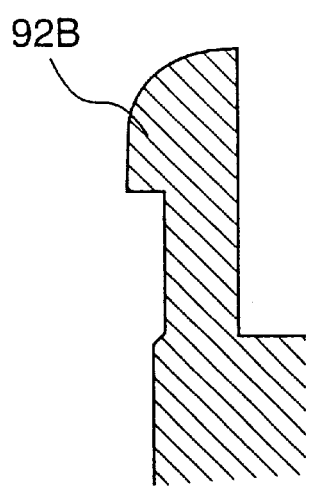
FIG. 16B is a cross-sectional view of another variation of the projection shown in FIG. 15.

FIG. 16B is a cross-sectional view of another variation of the projection 92. A projection 92B shown in FIG. 16B has a roundish upper-end surface, while a lower-end surface thereof has right angles. According to the shape of the projection 92B, the screw-connection part of the upper portion 16A-1 can be easily screwed to fit the screw-connection part of the lower portion 16A-2, while, once the screw-connection part of the upper portion 16A-1 has been screwed to fit the screw-connection part of the lower portion 16A-2, the lower-end surface of the projection 92B hinders the movement of the screw-connection part of the upper portion 16A-1, even when a large revolving force acts on the upper portion 16A-1.

Figure 17A:
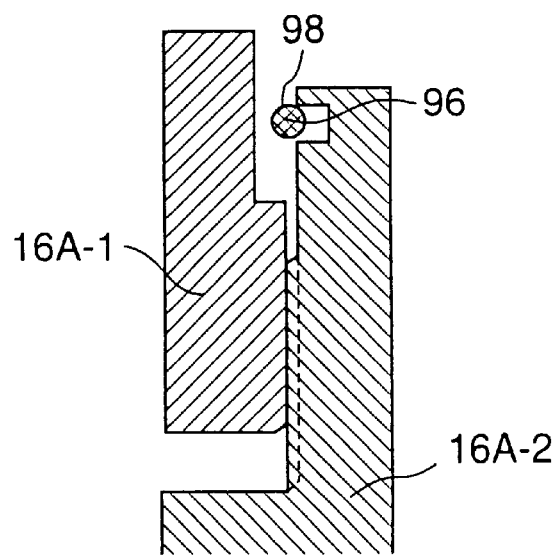
FIG. 17A is a cross-sectional view showing another example of a remove-stopper provided for the screw-connection parts shown in FIG. 12.
Figure 17B:
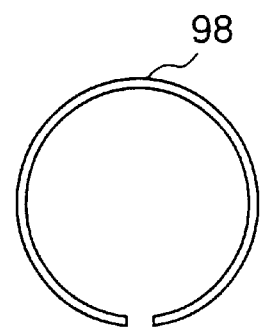
FIG. 17B is a plan view of a ring shown in FIG. 17A.

FIG. 17A is a cross-sectional view showing another example of the remove-stopper for the upper portion 16A-1. In the example shown in FIG. 17A, a groove 96 is formed along the outer periphery at the top of the screw-connection part of the lower portion 16A-2. In the groove 96 is arranged a ring 98 as a remove-stopper. FIG. 17B is a plan view of the ring 98. As shown in FIG. 17B, the ring 98 has a circular shape with a portion being removed, and is made of an elastic metal wire or a resin.

As shown in FIG. 17A, the ring 18 is formed so that a substantial half of the cross section thereof stays outside the groove 96. The ring 98 is set to the groove 96 beforehand, and when the screw-connection part of the upper portion 16A-1 is screwed toward the screw-connection part of the lower portion 16A-2, the ring 98 is compressed inwardly to have a smaller diameter. In other words, the ring 98 is contained completely in the groove 96 so that the screw-connection part of the upper portion 16A-1 can easily pass the ring 98.

After the screw-connection part of the upper portion 16A-1 has passed the ring 98, the ring 98 returns to the previous shape thereof, i.e., the sate shown in FIG. 17A. Therefore, when the upper portion 16A-1 moves in a reverse direction to be removed, the ring 98 functions as a remove-stopper to prevent the upper portion 16A-1 from moving beyond the ring 98.

Additionally, the ring 98 may be made of a shape memory alloy so that the ring 98 is returned to its previous shape by heating the ring 98 after the upper portion 16A-1 has been screwed in. That is, the ring 98 is arranged to memorize the shape shown in FIG. 17A, and then is made smaller in diameter when set into the groove 96. In other words, the ring 98 is made to have a smaller diameter so as to be contained completely in the groove 96. Then, after the upper portion 16A-1 has been screwed in, the ring 98 is returned to the shape shown in FIG. 17A so as to function as a remove-stopper.

Figure 18:
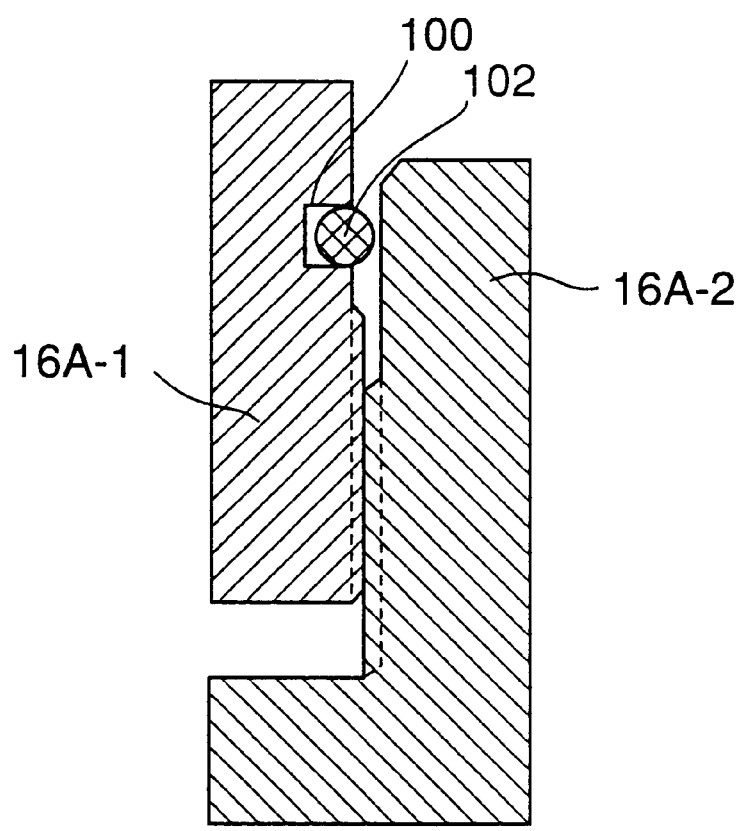
FIG. 18 is a cross-sectional view showing an example of a revolve-stopper provided for the screw-connection parts shown in FIG. 12.

FIG. 18 is a cross-sectional view showing an example of a revolve-stopper provided between the upper portion 16A-1 and the lower portion 16A-2. In the example shown in FIG. 18, a groove 100 is formed in the screw-connection part of the upper portion 16A-1. In the groove 100 is provided an O-ring 102 made of an elastic material such as rubber. Shapes of the groove 100 and the O-ring 102 are arranged so that the O-ring 102 adjoins the outer peripheral surface around the top of the screw-connection part of the lower portion 16A-2. Thereby, at the point where the screw-connection part of the upper portion 16A-1 is screwed in to some extent, the O-ring 102 contacts the screw-connection part of the lower portion 16A-2. Thereafter, with the O-ring 102 undergoing elastic deformation, the upper portion 16A-1 is further screwed in. Accordingly, the O-ring 102 is kept in a state of the elastic deformation between the screw-connection part of the upper portion 16A-1 and the screw-connection part of the lower portion 16A-2 so that the upper portion 16A-1 cannot be easily revolved due to a friction of the O-ring 102. This prevents vibration and other factors from causing the upper portion 16A-1 to revolve so as to change the distance between the lens 18 and the light-receiving surface 12a.

The present invention is not limited to the specifically disclosed embodiments, and variations and modifications may be made without departing from the scope of the present invention.

The present application is based on Japanese priority application No. 2000-320001 filed on Oct. 19, 2000, the entire contents of which are hereby incorporated by reference.

What is claimed is:

1. A semiconductor device for picking up an image, the device comprising:

a lens-mounting unit provided with a lens for picking up an image;

a semiconductor chip having a light-receiving element formed on a circuit-forming surface thereof, the light-receiving element converting light from said lens in to an image signal;

a flexible substrate provided between said lens-mounting unit and said semiconductor chip so as to supply said image signal to an external circuit; and a shading plate blocking light transmitting through said flexible substrate toward said semiconductor chip so as to substantially remove an influence of the light on said light-receiving element.

2. The semiconductor device as claimed in claim 1, wherein said semiconductor chip is mounted on said flexible substrate with said circuit-forming surface facing said flexible substrate so that said light-receiving element opposes said lens through an opening formed in said flexible substrate.

3. The semiconductor device as claimed in claim 1, wherein said lens-mounting unit has a locating pin, and said flexible substrate has a locating hole so that, in a state where the locating pin is inserted into the locating hole, said lens-mounting unit is fixed on a surface of said flexible substrate by an adhesive, the surface being opposite to a surface on which said semiconductor chip is mounted.

4. The semiconductor device as claimed in claim 1, wherein said shading plate extends from said lens-mounting unit toward said semiconductor chip in an opening formed in said flexible substrate.

5. The semiconductor device as claimed in claim 4, wherein said shading plate is formed of an elastic material, an end of said shading plate adjoining said circuit-forming surface.

6. The semiconductor device as claimed in claim 2, wherein said shading plate is formed as a part of said lens-mounting unit, an end of said shading plate being fixed on said circuit-forming surface by an adhesive.

7. The semiconductor device as claimed in claim 1, wherein said lens-mounting unit has a diaphragm defining an opening functioning as an aperture for said lens, an end of the diaphragm being an inclined surface inclined by a predetermined angle from an optical axis of said lens.

8. The semiconductor device as claimed in claim 1, wherein said flexible substrate has a wiring outlet to be connected to the external circuit, an electric component being mounted on the wiring outlet.

* * * * *